(12) United States Patent
Kobayashi et al.

(10) Patent No.: US 6,628,523 B2
(45) Date of Patent: Sep. 30, 2003

(54) CASING FOR ELECTRONIC CONTROL UNIT

(75) Inventors: Toshiki Kobayashi, Okazaki (JP); Hajime Katsuro, Nagoya (JP); Mitsuo Takahashi, Chiryu (JP); Toru Murowaki, Chiryu (JP); Toshio Fujimura, Okazaki (JP); Akinobu Makino, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/028,293

(22) Filed: Dec. 28, 2001

(65) Prior Publication Data

US 2002/0105787 A1 Aug. 8, 2002

(30) Foreign Application Priority Data

Feb. 8, 2001 (JP) ........................ 2001-031731
Feb. 21, 2001 (JP) ........................ 2001-044886

(51) Int. Cl.⁷ ............................................. H05K 1/14
(52) U.S. Cl. .................. 361/736; 361/752; 361/753; 361/801; 361/800; 361/737; 361/748; 361/759
(58) Field of Search ................. 361/736, 818, 361/816, 814, 800, 737, 790, 730, 796, 752, 753, 801, 728, 748, 759

(56) References Cited

U.S. PATENT DOCUMENTS

RE36,540 E  * 2/2000 Farquhar et al. ........... 156/73.1
6,181,564 B1 * 1/2001 Furusho ...................... 361/737

FOREIGN PATENT DOCUMENTS

| JP | A-63-138982 | 6/1988 |
| JP | A-1-218098 | 8/1989 |
| JP | A-7-131163 | 5/1995 |
| JP | A-10-42227 | 2/1998 |

* cited by examiner

Primary Examiner—David Martin
Assistant Examiner—Thanh Y. Tran
(74) Attorney, Agent, or Firm—Posz & Bethards, PLC

(57) ABSTRACT

A casing for an electronic control unit is composed of an upper case having a bottom opening and a bottom plate closing the bottom opening. The upper case is so formed that plural upper cases are easily stacked up and picked up one by one by an automated vacuum sucker. The sidewalls of the upper case facing each other are slanted, and a fringe portion is formed at a bottom end of each slanted sidewall. A U-shaped portion or a protrusion is formed on the fringe portion to prevent the upper case from sticking to another upper case when plural upper cases are vertically stacked up.

8 Claims, 9 Drawing Sheets

CASING FOR ELECTRONIC CONTROL UNIT

CROSS-REFERENCE TO RELATED APPLICATIONS

This application is based upon and claims benefit of priority of Japanese Patent Applications No. 2001-31731 filed on Feb. 8, 2001 and No. 2001-44886 filed on Feb. 21, 2001, the contents of which are incorporated herein by reference.

BACKGROUND OF THE INVENTION

1. Field of the Invention

The present invention relates to a box-shaped casing for containing an electronic control unit therein.

2. Description of Related Art

A substantially box-shaped casing is conventionally used as a casing for containing an electronic control unit. The casing is composed of an upper case having a bottom opening and a bottom plate to close the bottom opening. A printed circuit board on which electronic components are mounted is contained in the casing.

In an automated assembly line, plural upper cases are stacked up and picked up one by one from the top by an arm having a vacuum sucker. In this process, it is required to be able to stack up the upper cases straight and to be able to pick one upper case at a time. In a conventional upper case, to fulfill the above requirements, nuts 52 are positioned at four corners of a bottom fringe of the upper case 51 as shown in FIG. 12. Plural upper cases 51 are stacked up as shown in FIG. 13, so that the nuts 52 provide a certain space between neighboring upper cases 51, thereby preventing the upper case 51 from sticking to another upper case 51 located underneath. It is necessary, however, to give a certain height to the nut 52 in order to provide a required space between neighboring upper cases stacked up. Therefore, the nuts 52 specially made for this purpose have to be used, rendering the manufacturing cost high.

SUMMARY OF THE INVENTION

The present invention has been made in view of the above-mentioned problem, and an object of the present invention is to provide upper cases which are easily stacked up straight and are able to be picked up one by one with an automated sucker arm, while suppressing the manufacturing cost thereof.

A casing for containing electronic components therein is composed of an upper case and a bottom plate for closing a bottom opening of the upper case. The upper case is substantially box-shaped and includes a ceiling wall, sidewalls and fringe portions connected to the sidewalls. The upper case is so formed that a plurality of upper cases are easily stacked up and separately picked up one by one by an automated arm having a vacuum sucker.

Two sidewalls facing each other are slanted to widen the bottom opening relative to the ceiling wall. The fringe portion connected to the slanted sidewall is bent downward to form a U-shaped portion having an upper wall, a lower wall and a vertical wall connecting the upper wall to the lower wall. A length L1 of the lower wall is made shorter than a length L2 of the upper wall by a gap length L3, so that plural upper cases are easily stacked up. The gap length L3 is made smaller than the lower wall length L1, so that an amount of a horizontal shift of the stacked upper cases is limited to the small gap length L3. The U-shaped portion may be formed by bending the fringe portion upward, and also it may be separated into several portions. Alternatively, instead of forming the U-shaped portion connected to the fringe portion, protrusions projected inwardly may be formed on a vertical guide wall of the fringe portion.

When the upper cases are stacked up, each upper case is spaced from one another by the U-shaped portions or by the inwardly projected protrusions. Accordingly, the upper cases are picked up by the sucker arm one by one, avoiding the upper cases from being stuck together. The protrusions formed on the guide wall of the fringe portion may be engaged with depressions formed on a circuit board to be contained in the casing thereby to correctly position the circuit board in the casing.

According to the present invention, the upper cases are easily stacked up with certain spaces therebetween, while horizontally positioning each upper case, and they are picked up one by one by the sucker arm in the automated assembly line.

Other objects and features of the present invention will become more readily apparent from a better understanding of the preferred embodiments described below with reference to the following drawings.

DETAILED DESCRIPTION OF THE PREFERRED EMBODIMENTS

First Embodiment

A first embodiment of the present invention will be described with reference to FIGS. 1A–5. First, referring to FIGS. 1A and 1B, an electronic control unit (referred to as an ECU) contained in a casing of the present invention will be briefly described.

Figure 1A:
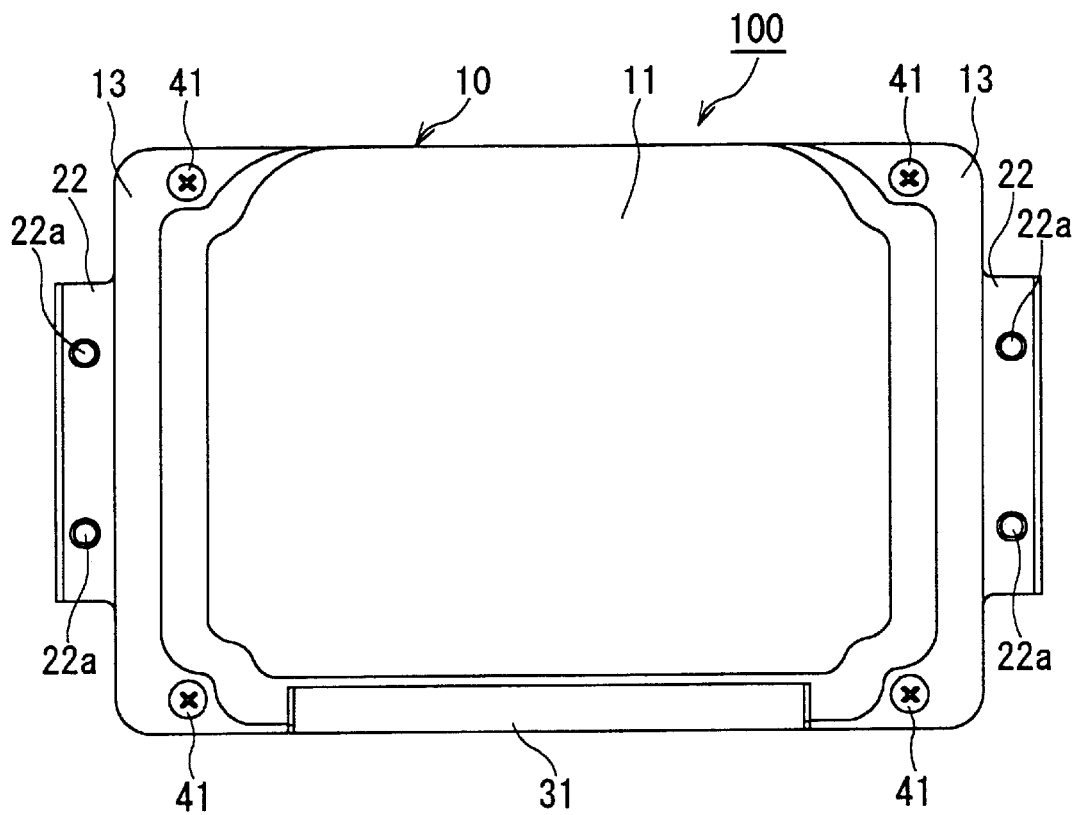
FIG. 1A is a plan view showing a casing in which an electronic control unit is contained, as a first embodiment of the present invention.
Figure 1B:
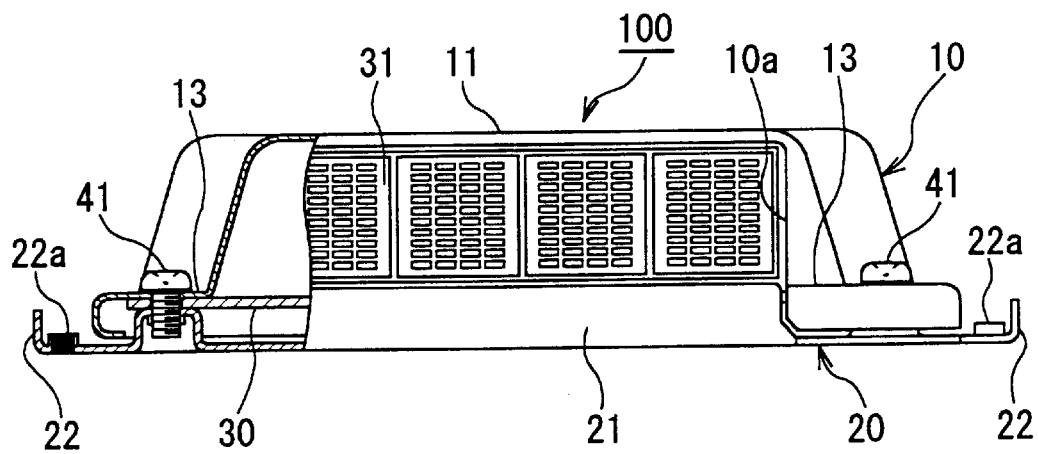
FIG. 1B is a side view showing the casing shown in FIG. 1A, a part of the casing being cut out.

FIG. 1A shows a top view of the ECU, and FIG. 1B shows a side view of the same. The ECU 100 is substantially composed of a casing and a printed circuit board contained in the casing. The casing is substantially box-shaped, and is composed of a metallic upper case 10 having a bottom opening and a metallic bottom plate 20 closing the bottom opening. The printed circuit board 30 having electronic components mounted thereon and a connector case 31 connected thereto is fastened to the upper case 10 together with the bottom plate 20 by screws 41 positioned at the four corners, as shown in FIG. 1B.

The upper case 10 includes an opening 10a from which the connector case 31 is exposed to the outside. The bottom plate 20 includes a standing wall 21 covering a lower part of the opening 10a and a pair of side brackets 22 having screw holes 22a for mounting the ECU 100 on a predetermined position.

Figure 2A:
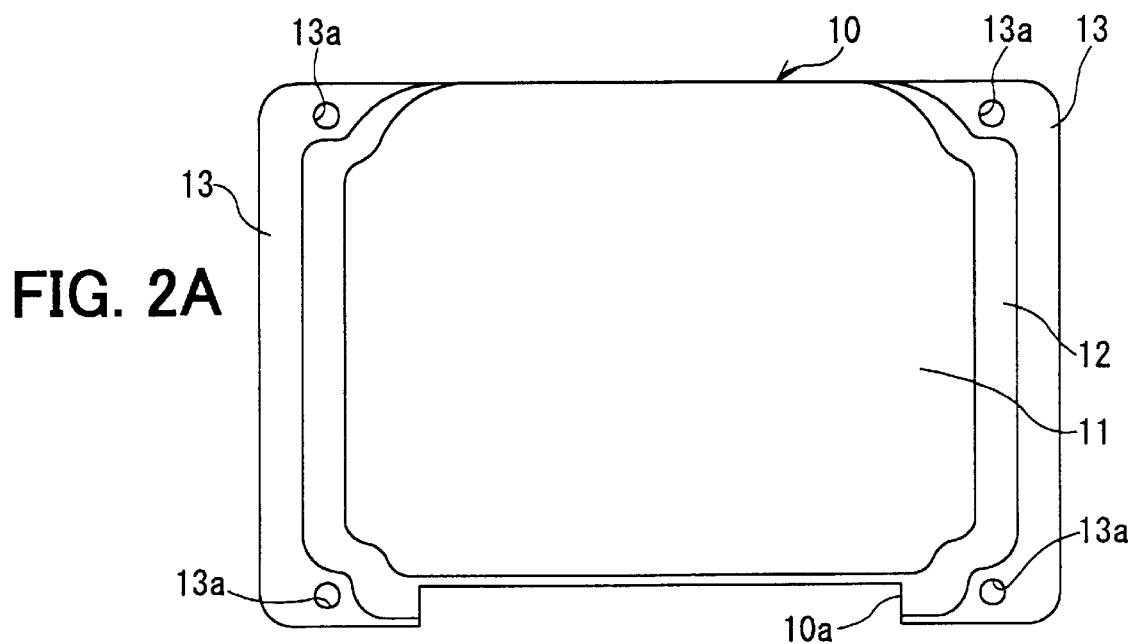
FIG. 2A is a top view showing an upper case used in the casing shown in FIG. 1A.
Figure 2B:
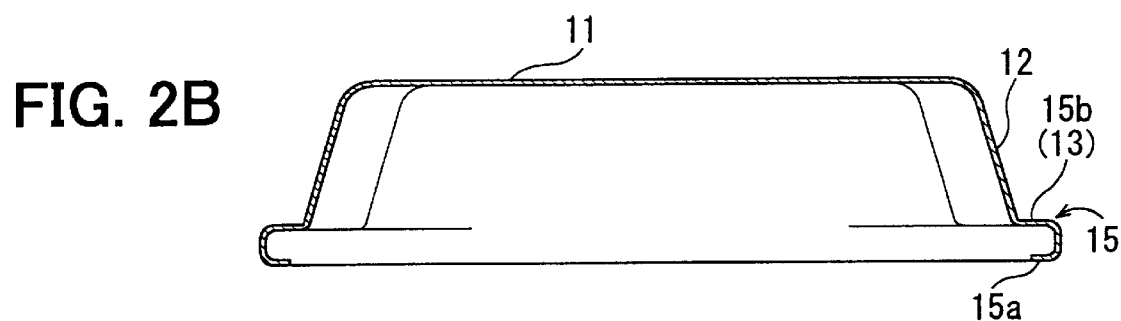
FIG. 2B is a cross-sectional view of the upper case.
Figure 2C:
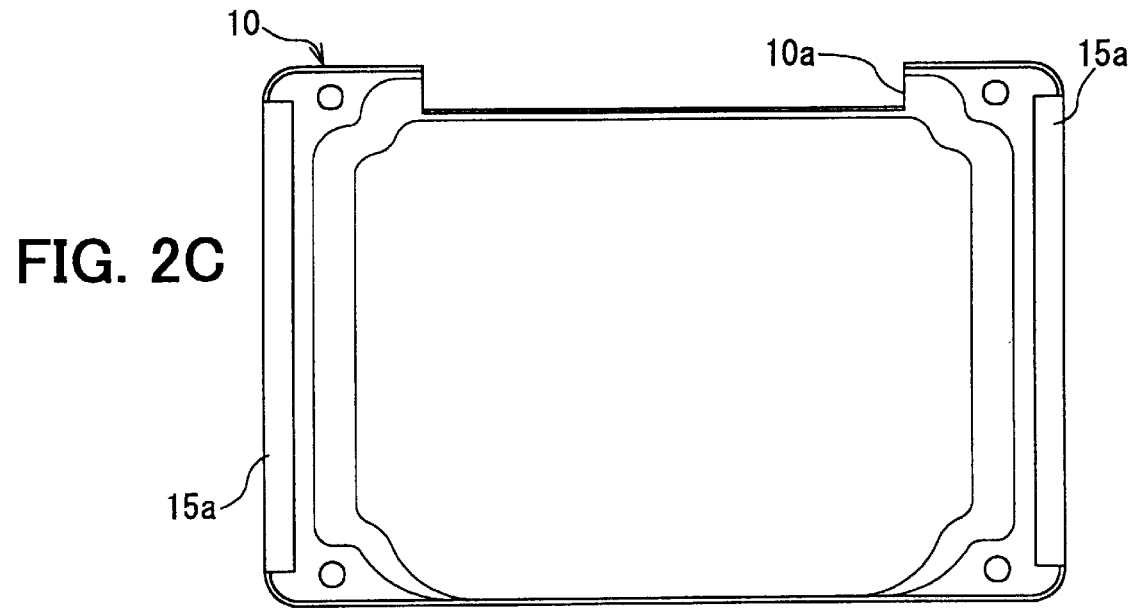
FIG. 2C is a bottom view of the upper case.

Referring to FIGS. 2A–2C showing a top view, a cross-sectional view, and a bottom view, respectively, the shape of the upper case 10 will be described in detail. The upper case 10 is formed from a metallic plate by presswork. The upper case 10 includes a ceiling wall 11, sidewalls 12 and fringe portions 13. The sidewalls 12 at three sides (right and left sides, and a side having the opening 10a) are slanted with a certain slant angle. U-shaped portions 15 bent downward are formed along the right and left side fringe portions 13, as shown in FIG. 2B. The U-shaped portion 15 includes an upper wall 15b and a lower wall 15a, both formed in parallel to the ceiling wall 11. Screw holes 13a for inserting the screws 41 are formed on the fringe portions 13 at four corners thereof.

Figure 3:
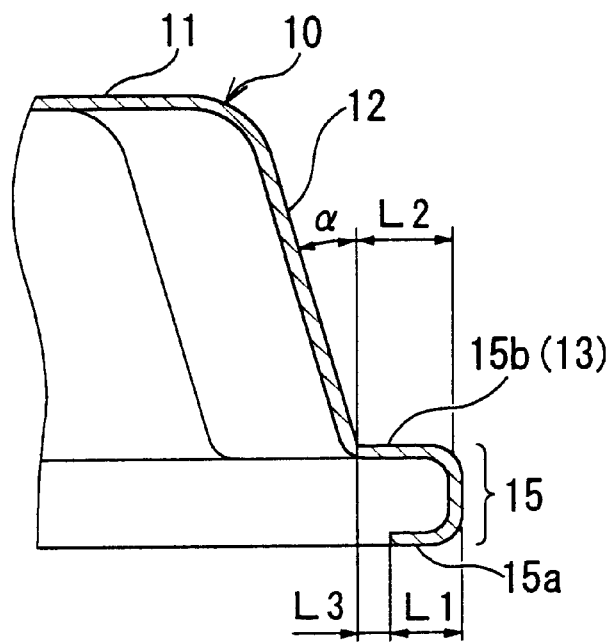
FIG. 3 is a cross-sectional view showing a part of the upper case in an enlarged scale.

Referring to FIG. 3, the slanted sidewalls 12 and the U-shaped portion 15 will be explained in detail. The sidewall 12 is slanted with a slant angle α (an angle made between a vertical line and the sidewall 12) which is determined to make the presswork easier and to obtain a required inside space. The U-shaped portion 15 is formed to satisfy the following relation: L2>L1>L3, where L1 is the length of the lower wall 15a, L2 is the length of upper wall 15b, and L3 is a difference between L2 and L1 (L3=L2−L1).

Figure 4:
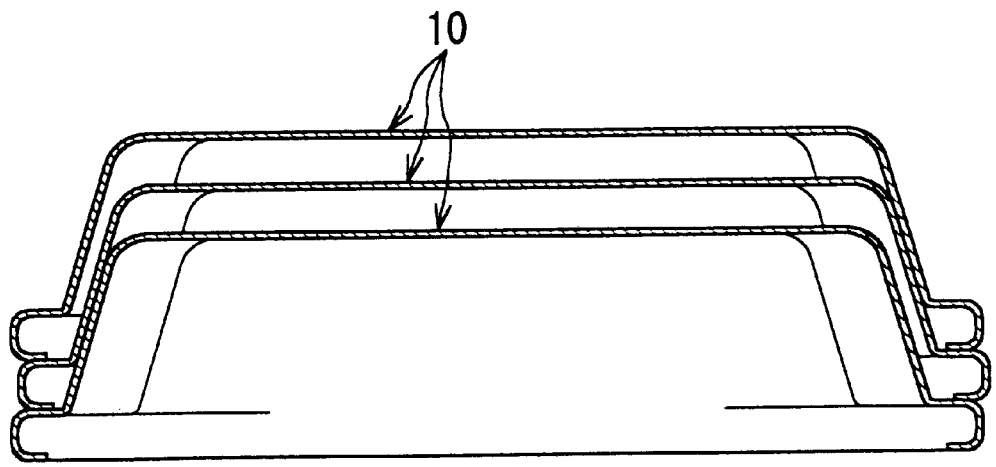
FIG. 4 is a cross-sectional view showing plural upper cases stacked up.

In an automated assembly line, the upper cases 10 are stacked up, so that they are picked up one by one by an arm having a vacuum sucker. FIG. 4 shows a stack of the upper cases 10. As the slant angle a of the sidewall 12 becomes larger, air flows more easily into a space between stacked upper cases 10, and each upper case 10 is separated from one another. On the other hand, as the slant angle a becomes too large, the upper cases 10 stacked up at a higher position tend to shift in the horizontal direction.

The upper case 10 described above includes the U-shaped portions having the upper wall 15b and the lower wall 15a, and the difference in length of both walls 15b, 15a is set to L3 (L3=L2−L1, and L3<L1). Therefore, a maximum amount of the horizontal shift of the stacked upper cases 10 is limited to L3. In other words, the horizontal shift stops at a point where the tip of the lower wall 15a abuts the foot of the sidewall 12, as shown in FIG. 4. Even if the horizontal shift occurs in the stack of the upper cases 10 due to the large slant angle a, the amount of the horizontal shift is limited to L3. In this manner, the shape of the upper case stack is maintained, and each upper case 10 can be picked up one by one by the sucker arm.

Further, the U-shaped portion 15 includes a vertical wall connecting the horizontal upper and lower walls 15a, 15b, and the vertical wall has a certain height. Therefore, a space is formed between stacked upper cases 10, and the ceiling wall 11 of each upper case 10 is always maintained in the horizontal direction. Accordingly, each of the stacked upper cases 10 is separately picked up by the automated sucker arm without fail. Since the length L1 of the lower wall 15a is made smaller than the length L2 of the upper wall 15b, a plurality of the upper cases can be easily stacked up. Since the upper and lower walls 15b, 15a are made in parallel to the ceiling wall 11, the stacked upper cases 10 are all maintained in the horizontal direction.

Figure 5:
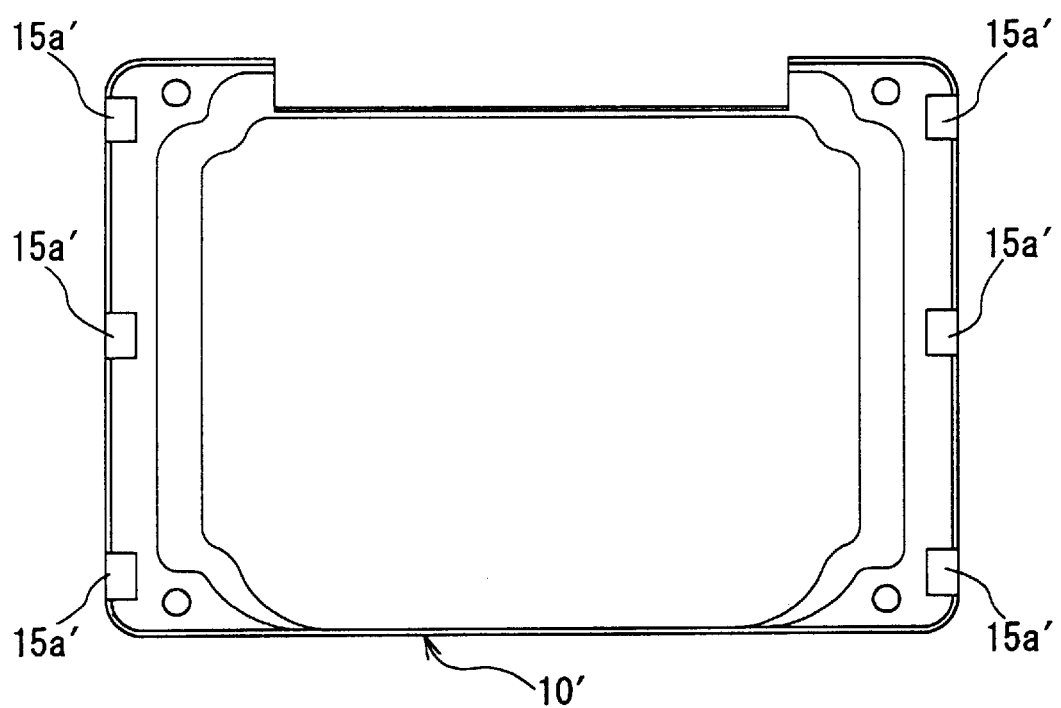
FIG. 5 is a bottom view showing a modified form of the upper case.

FIG. 5 shows a bottom view of a modified form of the upper case 10 described above, which is denoted as 10'. The U-shaped portion 15 formed along a fringe portion 13 is divided into three portions, two portions being positioned close to the corners and one portion in between. FIG. 5 shows only the lower walls 15a' of the divided U-shaped portions. Other structures of the upper case 10' are the same as those of the upper case 10 described above. The number and positions of the divided U-shaped portions may be variously modified. The modified upper cases 10' can be easily stacked up and separately picked up by the sucker arm in the same manner as the upper cases 10.

Though the U-shaped portion 15 is formed by bending the fringe portion 13 downward (to the direction opposite to the ceiling wall 11) in the foregoing embodiment and the modified form, it may be formed by bending upward (toward the ceiling wall 11). The upper cases 10 thus formed have the same advantages as those shown above.

Second Embodiment

Figure 6:
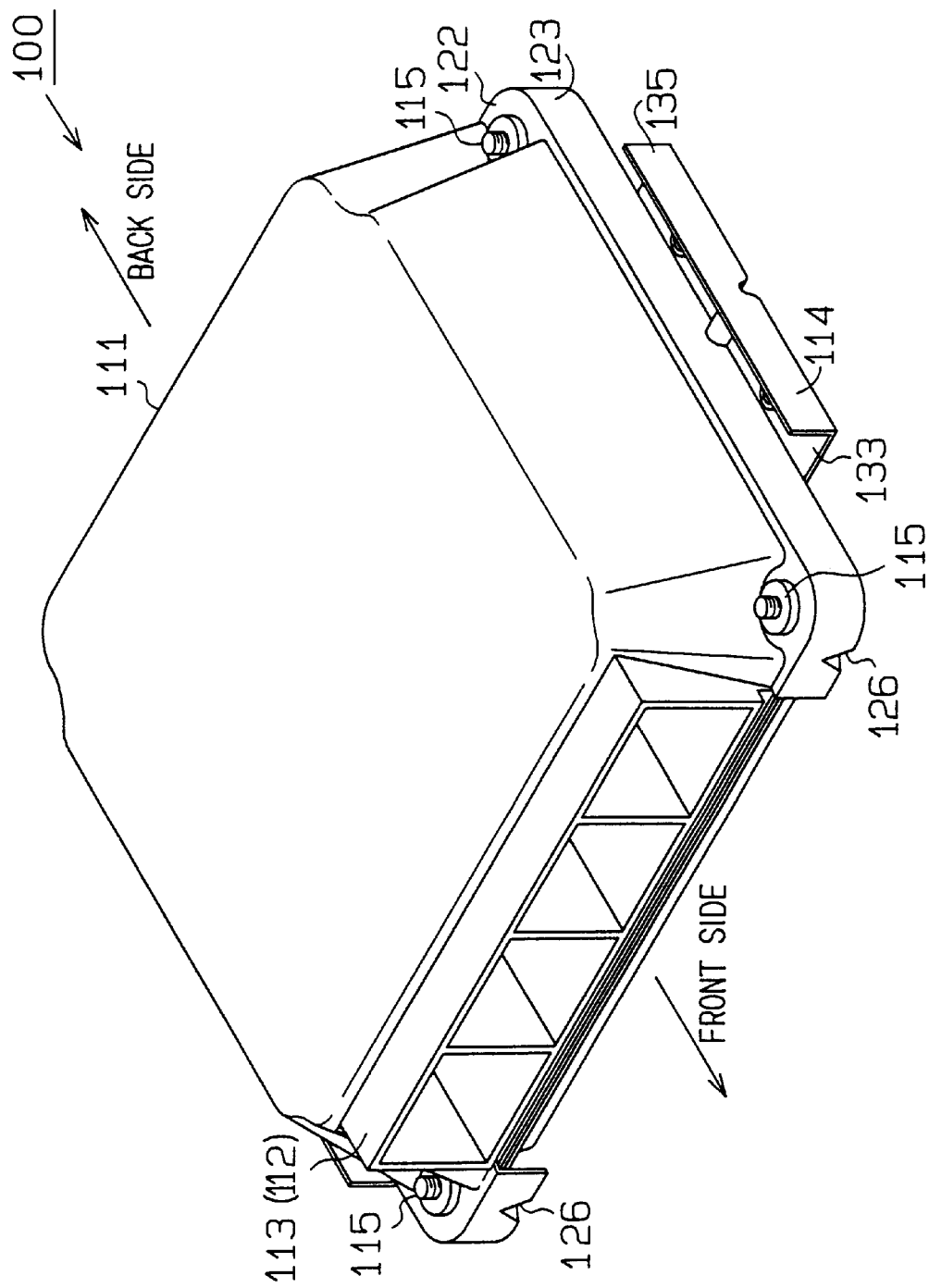
FIG. 6 is a perspective view showing a casing containing an electronic control unit therein, as a second embodiment of the present invention.
Figure 7:
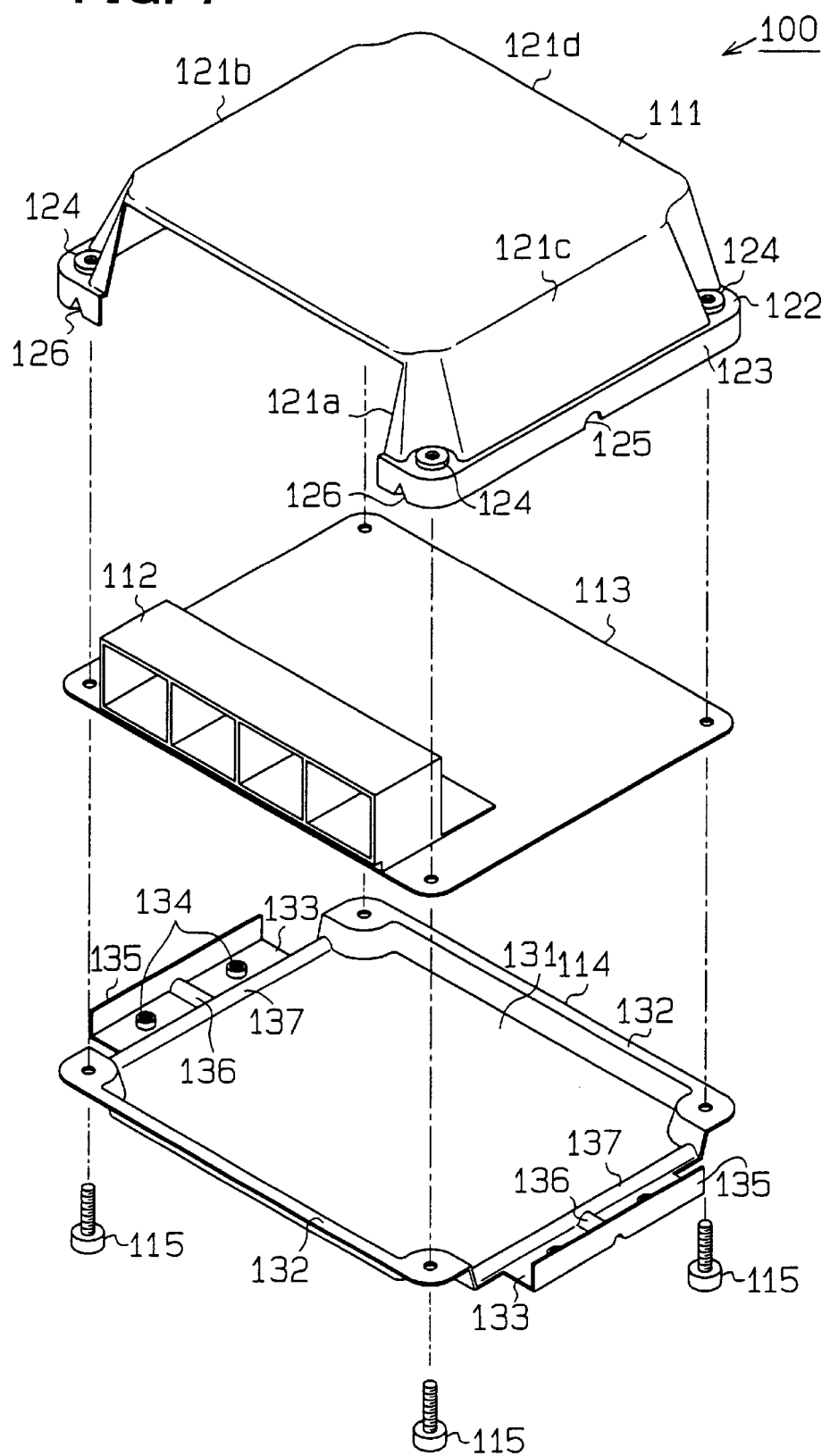
FIG. 7 is a perspective view showing components constituting the casing shown in FIG. 6.

A circuit board and other components are contained in a casing, forming an electronic control unit (ECU) 100. Referring to FIGS. 6 and 7, a structure of the casing will be described. The casing is composed of an upper case 111 having a bottom opening and a bottom plate 114 closing the bottom opening of the upper case 111. A circuit board 113 having a connector case 112 and other electronic components mounted thereon is sandwiched between the upper case 111 and the bottom plate 114. The upper case 111, the circuit board 113 and the bottom plate 114 are connected together by four screws 115 at four corners of the casing. The upper case 111 and the bottom plate 114 are made of a steel or aluminum plate or the like. For explanation purpose, as shown in FIG. 6, the connector side is denoted as a front side and its opposite side is denoted as a back side.

The upper case 111 includes a front opening 121a and three sidewalls 121b, 121c, 121d. The connector case 112 is disposed in the front opening 121a. Two sidewalls 121b, 121c are tapered in a direction to widen the bottom opening, while the back sidewall 121d stands straight. Fringe portion 122 having a vertical guide wall 123 is formed at the bottom end of each slanted sidewall 121b, 121c. A distance between both guide walls 123 is a little larger than a width of the circuit board 113. On the upper surface of the fringe portions, nuts 124 for screwing screws 115 are embedded at the four corners.

Figure 8:
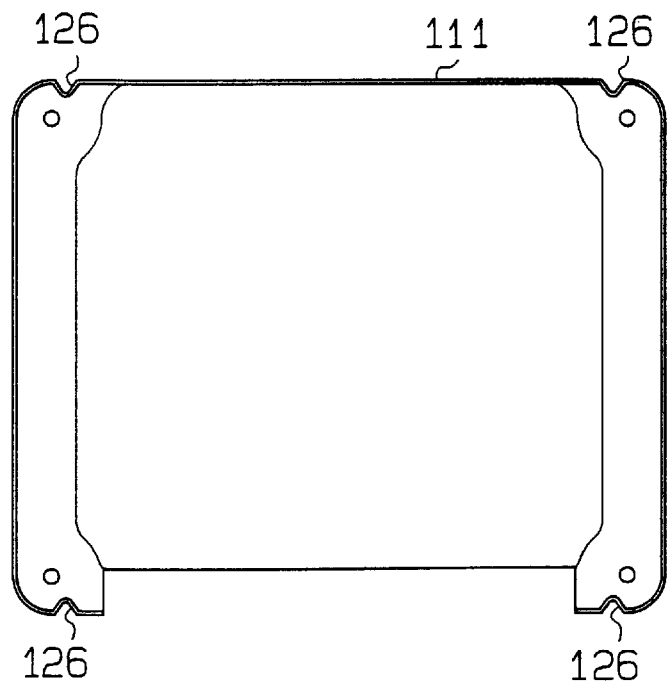
FIG. 8 is a bottom view of the upper case shown in FIG. 7.

Inward protrusions 126 projected to the inside space of the upper case 111 are formed on the guide walls 123 at the four corners. Each protrusion 126 is formed by inwardly pressing the guide wall 123 in a triangle pyramid shape. The positions where the inward protrusions are formed are better seen in FIG. 8 which shows a bottom view of the upper case 111.

The bottom plate 114 includes a bottom wall 131 and fringe walls 132 bent from the bottom wall 131. A peripheral size of the bottom wall 114 is substantially equal to that of the upper case 111. The circuit board 113 is sandwiched between the fringe portions 122 of the upper case 111 and the fringe walls 132 of the bottom plate 114. The bottom plate 114 also includes a pair of side rails 133 each having a vertically bent portion 135. Holes 134 for mounting the ECU 100 on a vehicle are formed on the side rails 133. A bracket for mounting the ECU on a vehicle may be connected to the side rails 133.

A pair of first ribs 136 extending from the bottom wall 131 across the side rail 133 are formed, and a pair of second ribs 137 running perpendicularly to the first rib 136 are formed on the bottom wall 131. The first ribs 136 engage with depressions 125 formed on the guide walls 123 of the upper case 111 when the bottom plate 114 is assembled to the upper case 111, so that the bottom plate 114 is correctly positioned relative to the upper case 111.

Figure 9:
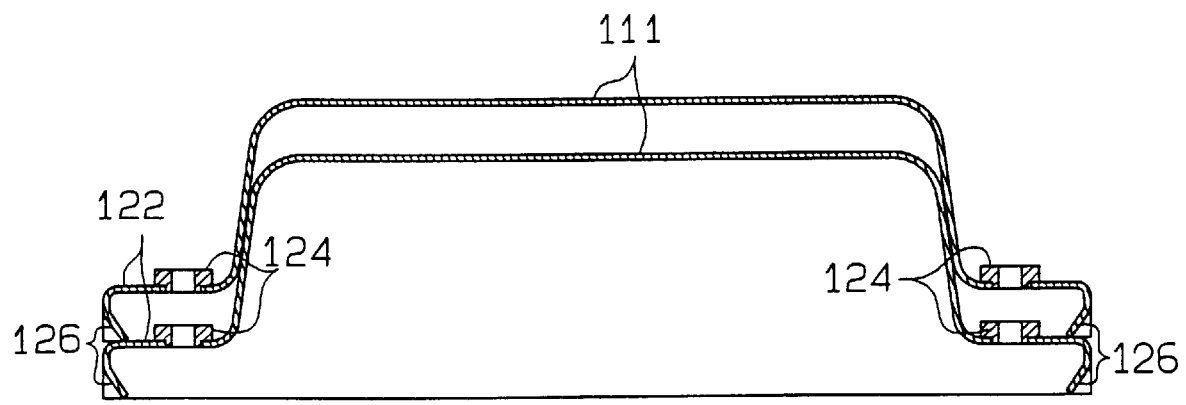
FIG. 9 is a cross-sectional view showing plural upper cases stacked up.

As shown in FIG. 9, plural upper cases 111 are stacked up in an automated process for assembling the ECU 100. The upper cases 111 are picked up by an arm having a vacuum sucker one by one from the stack of upper cases. In stacking up the upper cases 111, the inward protrusions 126 of each upper case are placed on the upper surface of the fringe portions 122 of another upper case positioned underneath. In this manner, the upper case 111 is prevented from sticking to another upper case 111 positioned thereunder. Without the inward protrusions 126, the vertical guide walls 123 may be telescopically connected to the vertical guide walls of another upper case positioned thereunder. In other words, the sticking problem of the stacked upper cases is solved by the protrusions 126 which are formed by simply pressing the guide walls 123 without using any additional member.

Figure 10:
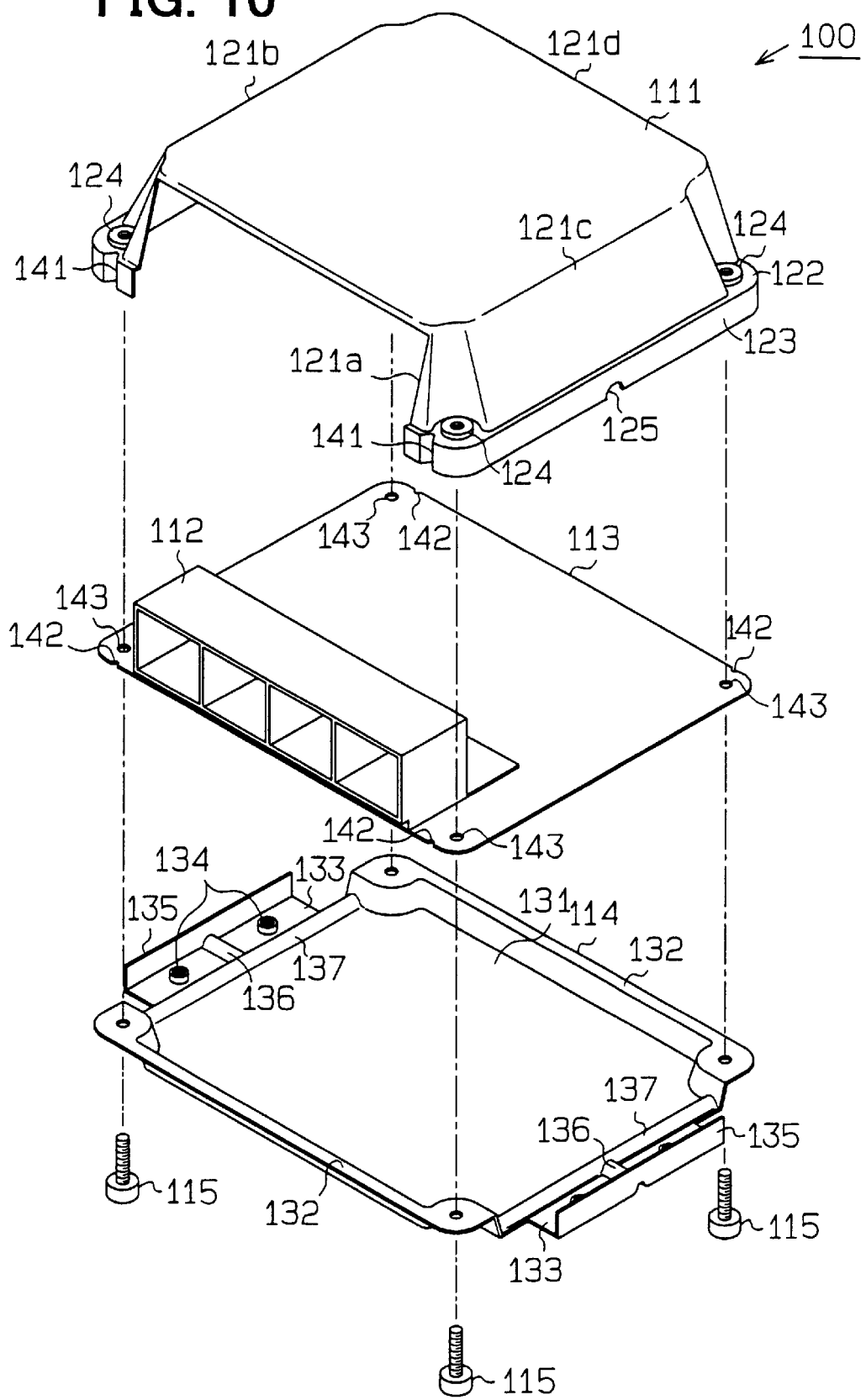
FIG. 10 is a perspective view showing components of the casing, the components being somewhat modified from those shown in FIG. 7.

A modified form of the second embodiment is shown in FIG. 10. In this modified form, the protrusion 126 having a trigonal pyramid shape is modified to a protrusion 141 having a triangular pillar shape. The protrusion 141 is formed throughout an entire height of the guide wall 123, while the protrusion 126 is formed only a half way. Further, depressions 142, each to be engaged with each protrusion 141, are formed at four corners of the circuit board 113. Other structures are the same as those of the second embodiment.

Figure 11:
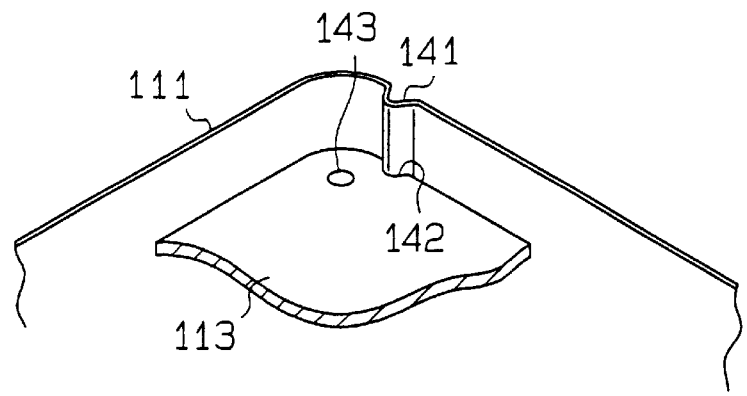
FIG. 11 is a perspective view showing a part of an upper case and a circuit board, an inward protrusion of the upper case being engaged with a depression formed on the circuit board.
Figure 12:
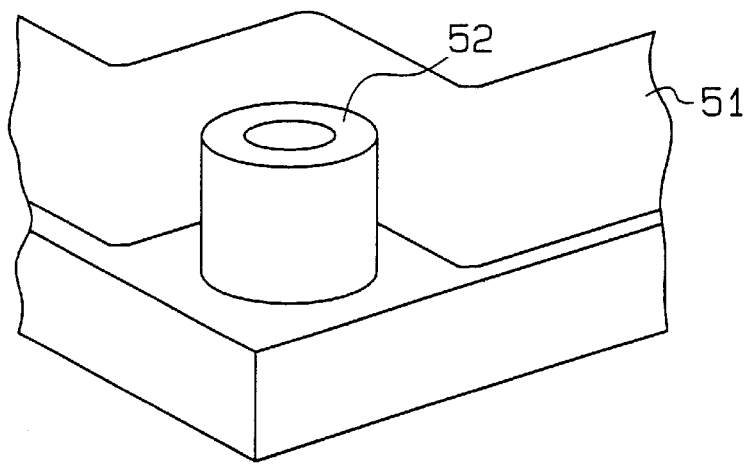
FIG. 12 is a perspective view showing a part of a conventional upper case having a tall nut.
Figure 13:
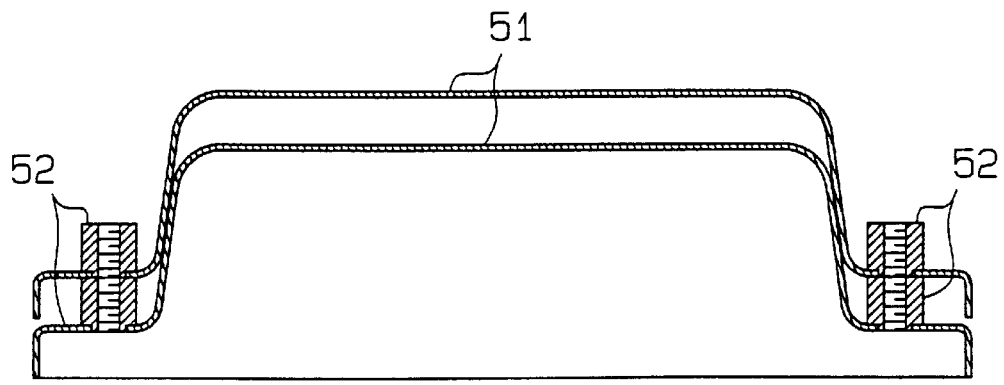
FIG. 13 is a cross-sectional view showing conventional upper cases stacked up.

When the circuit board 113 and the bottom plate 114 are assembled to the upper case 111 by inserting screws through holes 143 and fastening to the nuts 124, the inward protrusions 141 of the upper case 111 engage with the depressions 142 formed on the outer periphery of the circuit board 113, as shown in FIG. 11. In this manner, the circuit board 113 is correctly positioned in the casing without using any other positioning jigs. Further, the holes 143 of the circuit board 113 are automatically aligned to the nuts 124. Accordingly, the ECU 100 is efficiently assembled.

In this modified form, the sticking problem of the upper cases 111 is properly avoided by the protrusions 141 in the similar manner as in the second embodiment, and further the circuit board 113 is correctly positioned in the casing by making the protrusions 141 engage with the depressions 142.

The number of protrusions 126 or 141 is not limited to four. For example, two protrusions may be formed at the front side and one protrusion may be formed at a back side, or two each protrusions may be formed at both sides. The shape of the protrusions may be variously modified, as long as a number of upper cases 111 are properly stacked up while avoiding their sticking to one another.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A casing for a circuit board of an electronic control unit, the casing comprising:
a substantially box-shaped upper case having a ceiling wall, sidewalls connected to the ceiling wall and a bottom opening; and
a bottom plate for closing the bottom opening of the upper case, wherein:
at least two sidewalls facing each other are slanted in a direction to widen the bottom opening relative to the ceiling wall;
fringe portions are formed at bottom ends of the slanted sidewalls, each fringe portion including a guide wall extending in a direction perpendicular to the ceiling wall; and
means for preventing the upper case from sticking to another upper case when a plurality of upper cases are stacked, the preventing means being formed on the guide wall.

2. The casing as in claim 1, wherein:
the preventing means is a protrusion inwardly projected from the guide wall to an inside space of the upper case.

3. The casing as in claim 2, wherein:
the protrusion is shaped in a trigonal pyramid so that a base of the trigonal pyramid is positioned on a fringe portion of the another upper case when the plurality of the upper cases are stacked.

4. The casing as in claim 2, wherein:
the protrusion is shaped in a triangular pillar extending along an entire height of the guide wall so that a base of the triangular pillar is positioned on the fringe portion of the another upper case when the plurality of upper cases are stacked.

5. The casing as in claim 4, wherein:
the protrusion engages with a depression formed at an outer periphery of the circuit board so as to correctly position the circuit board in the casing.

6. A casing for a circuit board of an electronic control unit, the casing comprising:
a substantially box-shaped upper case having a ceiling wall, sidewalls connected to the ceiling wall and a bottom opening; and
a bottom plate for closing the bottom opening of the upper case, wherein:
at least two sidewalls facing each other and being slanted to widen the bottom opening relative to the ceiling wall; and
fringe portions formed at bottom ends of the slanted sidewalls and each including a U-shaped portion bent from the fringe portion and having an upper wall, a vertical wall and a lower wall, both the upper and the lower walls being parallel to the ceiling wall, the lower wall continuously extending throughout an entire length of the bottom end of the slanted sidewall so that the lower wall is positioned on the U-shaped portion of another upper case when a plurality of the upper cases are stacked, thereby preventing the upper case from sticking to the another upper case.

7. The casing as in claim 6, wherein:
a length of the lower wall of the U-shaped portion is shorter than a length of the upper wall of the U-shaped portion.

8. The casing as in claim 7, wherein:
a difference between the length of the upper wall and the length of the lower wall is smaller than the length of the lower wall.

* * * * *